United States Patent [19]

Schierz

[11] 3,783,346

[45] Jan. 1, 1974

[54] SEMICONDUCTOR ARRANGEMENT

[75] Inventor: Winfried Schierz, Nurnberg, Germany

[73] Assignee: Semikron Gesellschaft fur Gleichrichterbau und Elektronik mbH, Nurnberg, Germany

[22] Filed: Nov. 8, 1971

[21] Appl. No.: 196,291

Related U.S. Application Data

[63] Continuation-in-part of Ser. No. 8,996, Feb. 5, 1970.

[30] Foreign Application Priority Data

Apr. 1, 1969 Germany .................. P 19 16 554.9

[52] U.S. Cl. ......................... 317/234 R, 317/234 R
[51] Int. Cl. ............................................. H01l 5/00
[58] Field of Search ......................... 317/234, 5, 4, 6

[56] References Cited

UNITED STATES PATENTS

| | | | |
|---|---|---|---|
| 3,702,954 | 11/1972 | Mosch et al. | 317/234 |
| 3,569,797 | 3/1971 | Simmons | 317/234 |

*Primary Examiner*—John W. Huckert
*Assistant Examiner*—E. Wojciechowicz
*Attorney*—George H. Spencer

[57] ABSTRACT

A semiconductor arrangement including a continuous band of planar conductive material forming a geometric structure with periodically repeating zones. The structure has conductor portions connected together by a longitudinal edge strip serving as a transporting strip, at least one contact bar extending alongside the transporting strip and connected to the transporting strip by a plurality of ones of the conductor portions, and planar contact portions which are also connected to the transporting strip and arranged between pairs of the plurality of conductor portions. The contact bar is arranged to be offset and to overlap a number of the contact portions by bending the conductor portions in the direction of the transporting strip and to contact the contact portions under pressure in the manner of a spring to form a clamp-type mount with the contact portions for at least one semiconductor wafer.

8 Claims, 6 Drawing Figures

SEMICONDUCTOR ARRANGEMENT

BACKGROUND OF THE INVENTION

The present application is a continuation-in-part of applicant's copending U.S. Pat. application Ser. No. 8,996, filed on Feb. 5th, 1970. The prior filed parent application relates to a semiconductor arrangement with semiconductor rectifier elements arranged in a plane whose semiconductor wafers are contacted between the sections of associated conductor portions which form a clamp-type mount.

According to the parent application, the conductor portions, which are produced in any desired number, from a preferably continuous, band-shaped or planar conductor material, form a planar, geometric structure with periodically repeated zones. The conductor portions are connected together with a longitudinal edge zone of the conductor material which serves as a transporting strip. One of a pair of adjacent planar conductor portions associated with each semiconductor wafer is bent out of the plane of the band of material and offset in parallel and arranged to over-lap the other of the pair of adjacent conductor portions to form the clamp-type mount for the semiconductor wafer. The center lines of the ends of each conductor portion which serve as the external leads also serve as markings for separating the geometric structure into desired rectifier circuits and/or individual semiconductor elements.

SUMMARY OF THE INVENTION

The semiconductor arrangements according to the present invention relate to an advantageous, unobvious further improvement of the semiconductor arrangement disclosed in the parent application and is accomplished in that the band shaped or planar geometric conductor structure comprises a transporting strip, at least one contact bar extends alongside the transporting strip and is connected therewith via bar-type conductor portions serving as connecting conductors and planar contact portions which are disposed between the conductor portions and connected with the transporting strip. The contact bar is arranged adjacent the contact portions to be offset and to overlap a number of the contact portions by bending the conductor portions in the direction of the transporting strip and to contact the contact portions under pressure in the manner of a spring. The spring effect is achieved by the selection of an appropriately elastic conductor material so that the contact bar and the contact portions form clamp-type mounts for holding at least one semiconductor wafer each.

DESCRIPTION OF THE PREFERRED EMBODIMENTS

Figure 1:
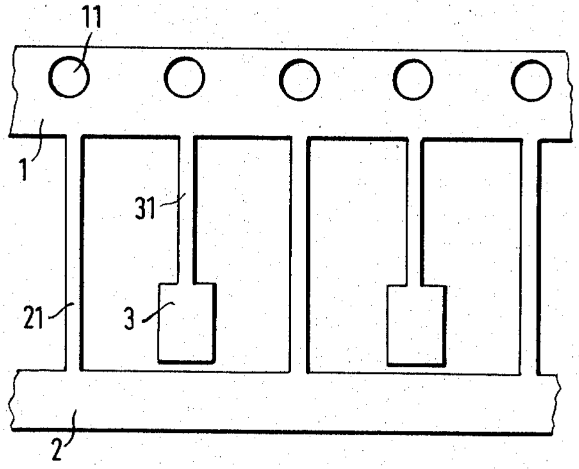
FIG. 1 is a plan view of a reprensentative portion of one embodiment of the geometric conductor structure for producing semiconductor arrangements according to the present invention.

Referring now to FIG. 1, a representative portion of a geometric structure is shown to include a single continuous longitudinal edge zone forming a transporting strip 1 of the band-shaped or planar conductor material constituting the geometric structure. The other longitudinal edge zone is formed by a continuous contacting bar 2. Both the transporting strip 1 and the contacting bar 2 are common to all semiconductor arrangements which can be produced from the geometric conductor structure. The contacting bar 2 is connected with the transporting strip 1 via a number of, e.g., parallel, bar-shaped conductor portions 21, which serve as the connecting conductors. Between adjacent ones of the connecting conductors 21, contact portions 3 are provided, which are separated from the contacting bar 2 and which are connected with the transporting strip 1 via bar-shaped conductor portions 31 which also form connecting conductors.

The width of the contacting bar 2 and the areal expanse of the contact portions 3 are codetermined by the contacting surfaces of the semiconductor wafers 4 intended to be contacted therebetween. The operating conditions, circuit considerations and regulations concerning the minimum spacing to prevent creeping currents and/or voltage breakdowns during use of the desired semiconductor arrangements as well as other technical considerations during further processing of the geometric structure determine the dimensions, mutual spacing and arrangement of the connecting conductors 21, 31. For example, the mutual spacing of the connecting conductors 21, 31 may correspond to a certain raster dimension for use in circuit boards.

The transporting strip 1 is advantageously provided with perforations 11 to permit more economical fabrication of arrangements according to the present invention, the perforations are preferably arranged to correspond to the spacing of the connecting conductors 21, 31. The contact portions 3 may be polygonal or circular and, under consideration of their simultaneous use as heat conducting metals, may have an areal expanse which is large compared to the contact surface of the semiconductor wafers 4 to be fastened thereonto.

Figure 2:
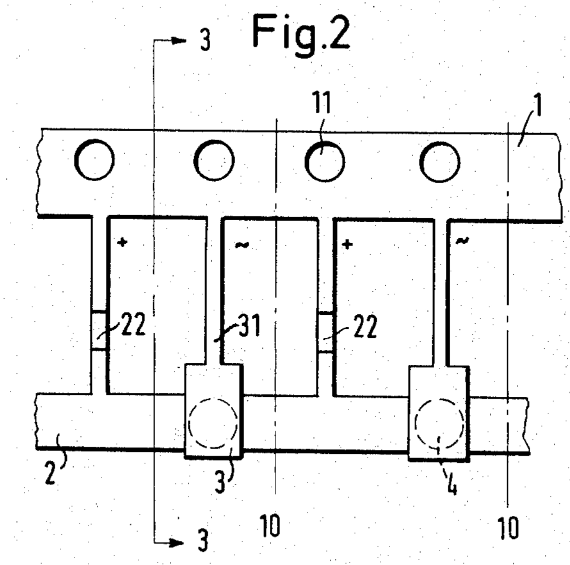
FIG. 2 is a plan view illustrating the displaced orientation of the conductor portions of the geometric conductor structure of FIG. 1 and the thereby achieved mutual association of segments of the conductor portions intended for holding and contacting the semiconductor wafers.
Figure 3:
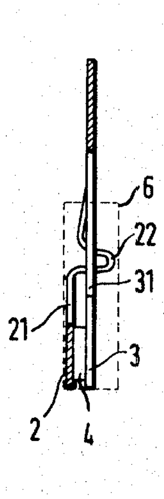
FIG. 3 is a side view taken along line 3—3 of FIG. 2 illustrating the bending and oriented offsetting of certain of the conductor portions.

As shown in FIGS. 2 and 3, the clamp-shaped mounts constituted by the contacting bar 2 and the contact portions 3 for holding and fixing the semiconductor wafers 4, are formed by, preferably, approximately parallelly offsetting the contacting bar 2 by bending all of the connecting conductors 21 to form a bent portion 22 thereof, so that the contacting bar 2 is disposed at least partially opposite in area to the contact portions 3, i.e., the contacting bar 2 overlaps the contact portion 3.

Contacting bar 2 and contact portions 3 are in contact with one another, as a result of the selection of the elastic property of an appropriate elastic conductor material. This contact results in a spring pressure so that the insertion and holding of at least one semiconductor wafer 4 is assured at each contacting portion 3. The contacting bar 2 and the contact portions 3 are arranged at such an angle to one another that they are in areal contact with the semiconductor wafer 4 after its insertion therebetween. In this manner it is possible to simultaneously obtain any desired number of clamp-shaped mounts for producing semiconductor arrangements.

Instead of bending the connecting conductors 31 to form the bent portions 22, two or more appropriately dimensioned arc-shaped configurations may also be provided.

In view of the requirements for rigid external leads, particularly for installation in circuit boards, the bent portions 22 are, according to the present invention, so arranged that they will lie within a housing 6 for the semiconductor arrangement. It may also be desirable, according to the illustration in FIG. 3, for the bent portions 22 to take an arc-shaped configuration which protrudes on one side from the plane of the contacting bar 2 and whose external dimension is adapted to the inner dimension of the housing 6. In this way, the bent portion 22 simultaneously serve in an advantageous manner as a plug-in mount for the geometric conductor structure of the semiconductor arrangement during installation in the housing 6.

The separation of the geometric conductor structure after insertion and contacting of the semiconductor wafers 4 is accomplished, as shown in FIG. 2, between the same type of consecutive connecting conductors, for example along the lines 10, which indicate the zonal separation of the structure.

Figure 4:
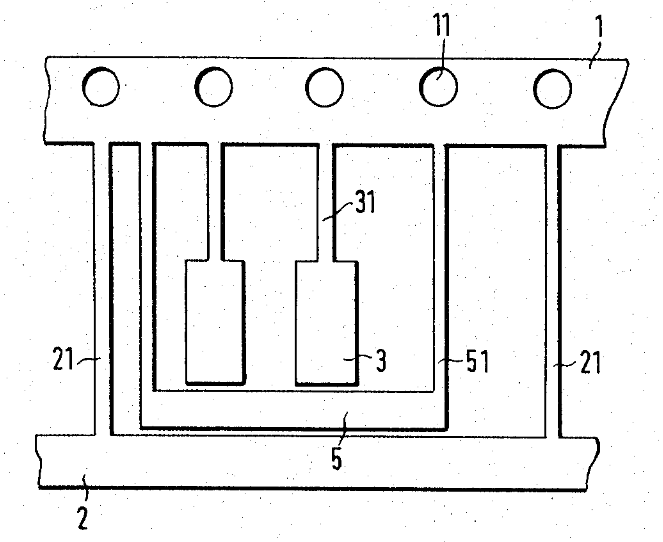
FIG. 4 is a plan view of a representative portion of the geometric structure for producing semiconductor arrangements in a single-phase bridge embodiment according to the present invention.
Figure 5:
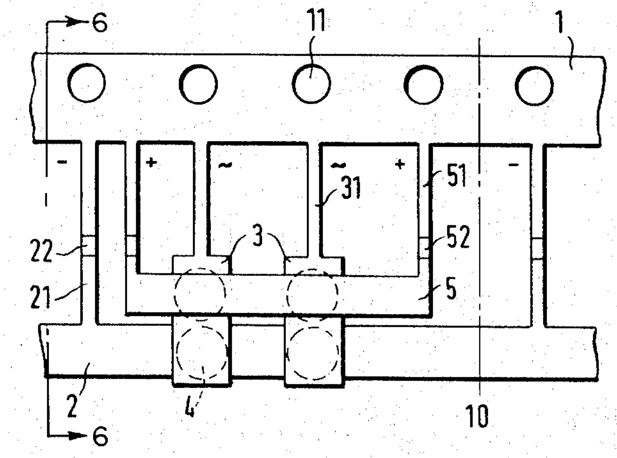
FIG. 5 is a plan view illustrating the displaced orientation of the semiconductor arrangement of FIG. 4.

Semiconductor arrangements with two direct current terminals, for example, those in single-phase bridge connections as shown in FIGS. 4 and 5, require, in addition to the contacting bar 2 a further conductor portion, which in this case, serves as the second direct current terminal.

FIG. 4 shows the mutual planar association of the connecting conductors 21, 31, 51 and the contact portions 3 of the geometric structure.

Between the contacting bar 2, which represents, for example, the negative terminal, and contact portions 3 of each zone of the structure, which correspondingly serve as a.c. terminals, a further contact bar 5 is provided for the simultaneous contacting along with the bar 2 a plurality of semiconductor wafers 4. The contact bar 5, which constitutes the positive terminal, extends parallel to the contacting bar 2 and is connected at one edge thereof, via bar-shaped connecting conductor sections 51 with the transporting strip 1. The contacting bar 5 is arranged, for construction and circuit arrangement reasons, in that longitudinal section of the geometric conductor structure which is defined by the adjacent conductor portions 21. The width of the conducting bar 5 is determined by the contacting surfaces of the semiconductor wafers 4 to be supported. As discussed above in connection with FIG. 1, the spacing of the connecting conductors 21, 31, 51 and their arrangement is determined by production considerations during manufacture as well as by the requirements regarding placement of the electrical connections and the maintaining of insulation distances when the desired semiconductor arrangements are placed in operation.

In the embodiment shown in FIGS. 4 and 5, the contact bar 5, which constitutes the positive terminal, is so disposed, based on the fixed polarity of the contact bar 2 and contact portions 3, that one of its connecting conductors 51 has a distance from the other connecting conductors 21, 31 which is determined by the given position of the leads of the finished semiconductor arrangements; while the other connecting conductor 51, which is shown in FIG. 5 to the left of contact portions 3, is additionally provided only to improve the manufacturing process. However, if desired or required, one or both of the connecting conductors 51 may be disposed at a distance from the adjacent connecting conductors 21, 31 which coincides with the spacing between these other connecting conductors.

Figure 6:
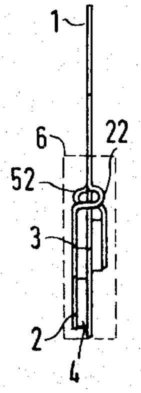
FIG. 6 is a side view taken along line 6—6 of FIG. 5 illustrating the bending and oriented offsetting of certain of the conductor portions.

According to the present invention, the contacting and connecting components in each zone of the geometric conductor structure which, as shown in FIG. 4, are provided for contacting and connecting four semiconductor wafers, have a mutual spatial relationship, as shown in FIG. 5, such that the contacting bar 2 has its connecting conductors 21 bent to form the bent portions 22 and the contacting bar 5 has its connecting conductors 51 bent to form bent portions 52. According to this relationship the contacting bar 2 is disposed on one side of the contact portions 3 and the contacting bar 5 is disposed on the other side thereof which faces away from the contacting bar 2. In this way, contact elements 2, 3 and 5 lie in three planes with each contact bar 2, 5 holding two semiconductor wafers 4 on both sides of the contact portions 3. The bent portions 22, 52 are each formed, as shown in FIG. 6, in the direction of contact portions 3. The wafers 4 are inserted in an electrical orientation which is determined by the connection sequence for the contact components.

The contacting bar 2 and the contacting bar 5 may be arranged either mutually offset (FIG. 5) or in coincidence (not shown). The required areal expanse of both contacting bars is codetermined by their position and the contacting surfaces of the semiconductor wafers 4. For example in one embodiment of the present invention, the contacting bars 2 and 5 may each contact the same surface of the contact portions 3.

To arrange the connecting conductors in some other connection sequence, the contact portions 3 may, for example, form the d.c. terminals, while the contacting bar 2 and the contacting bar 5 form the a.c. terminals.

Further embodiments may consist in that the contact bar 5, in order to produce a certain sequence of conductor terminals, for example, is provided with only a center connecting conductor between the contact portions 3 instead of with two outer connecting conductors 51. The center connecting conductor could be arranged in the corresponding mutual spacing with the remaining connecting conductors. In another exemplary embodiment, the bar 5 could be provided with a center connecting conductor and an outer connecting conductor which follows contact portions 3. In still another exemplary embodiment, the bar 5 could be provided with a center connecting conductor and two outer connecting conductors. These possible variations permit, with the appropriate separation of each repeating zone of the conductor structure, the arrangement of semiconductor devices in a so-called open bridge connection in a particularly simple manner.

A particularly economical fabrication of semiconductor arrangements according to the present invention is possible when the structure comprising a contacting bar 2, contacting portions 3 and, if required, contacting bar 5, is arranged on both, i.e., opposite, sides of the transporting strip 1.

The structure according to the present invention including the conductor portion arrangements thus permits the fabrication of any desired rectifier circuit with any desired sequence of the terminals.

To manufacture semiconductor arrangements according to the present invention the geometric conductor structures are preferably formed by stamping or etching of band shaped conductor material and are shaped, for example, as shown in FIG. 4. In one process step, the contacting bars 2 and 5 are arranged to form with the contacting portions 3 clamp-shaped mounts by bending of the connecting conductors 21, 51. Into each of these clamp-shaped mounts formed in this way at the overlap areas defined by the contacting bars and the contact portions, a semiconductor wafer 4 is inserted according to the electrical orientation required by the particular circuit. In a subsequent process step all of the semiconductor wafers are simultaneously permanently connected with their associated contact components, for example by immersion soldering. The structure consisting of conductor portions and semiconductor wafers is then subjected to further known process steps of, for example, separation, cutting off of excess terminals, encapsulation and testing.

Some of the advantages of the present invention are, for example, that the overlapping arrangement of contact components formed of a band of conductor material and connected together in one plane permits the manufacture of any desired number of contact points by means of bending certain of the conductor elements to form clamp-shaped mounts for semiconductor wafers; that the bent portions provided, which are provided to serve as connecting conductors, also serve simultaneously to fix the conductor arrangements when they are being installed in a housing; and that any desired number of rectifier circuits with any desired sequence of terminals can be obtained from the appropriately configured conductor structures.

It will be understood that the above description of the present invention is susceptible to various modifications, changes and adaptations, and the same are intended to be comprehended within the meaning and range of equivalents of the appended claims.

I claim:

1. In a semiconductor arrangement having a plurality of semiconductor devices, particularly rectifier devices, aligned in a plane, with the semiconductor wafers of said devices being contacted between sections of associated conductor portions which form a clamp-type mount; wherein said arrangement includes a continuous band-shaped or planar strip of conductor material which is provided with openings to form a planar geometric structure therein with periodically repeating zones, the structure having bar-shaped conductor portions connected together by a longitudinal edge zone which serves as a transporting strip, and with one of the conductor portions which is associated with a semiconductor wafer being bent out of the plane of said band and displaced parallelly so that it overlaps the other conductor portion associated with the same conductor wafer to thereby form the clamp-type mount for the semiconductor wafer, and with the center line of one section of each conductor portion which constitutes an external lead for a device serving as a reference mark for separating the geometric structure into any number of desired rectifier circuits, the improvement wherein said geometric conductor structure comprises: at least one continuous contact bar extending parallel to said transporting strip and being connected to said transporting strip by a plurality of ones of said associated conductor portions, which serve as external connecting leads, and planar contact portions which are disposed between pairs of said plurality of said associated conductor portions which are connected with said transporting strip; and, said plurality of conductor portions associated with said contact bar being bent so as to parallelly offset said contact bar in the direction toward said transporting strip so that said contact bar overlaps a plurality of said contact portions and, due to the selection of an appropriate elastic material, contacts said contact portions under pressure in the manner of a spring so as to form one of said clamp-type mounts with each said overlapped contact portion for holding at least one semiconductor wafer.

2. A semiconductor arrangement as defined in claim 1, wherein said contact bar is formed by an additional longitudinal edge strip of said planar conductive material, and wherein all of said zones of said geometric structure are connected together by said contact bar provided as a continuous contacting strip.

3. A semiconductor arrangement as defined in claim 1, further comprising a further continuous contact bar disposed in each zone of said geometric structure between the other said contact bar and said transporting strip and extending parallel to said transporting strip, said further contact bar being connected by a plurality of said bar-shaped conductor portions with said transporting strip and forming therewith a pair of contacting components for d.c. or a.c. connection.

4. A semiconductor arrangement as defined in claim 3 wherein said plurality of bar-shaped conductor portions associated with said further contact bar are bent so as to parallelly offset said further contact bar in the direction toward said transporting strip so that said further contact bar overlaps a plurality of said contact portions, and, due to the selection of an appropriate elastic material, contacts said contact portions under pressure in the manner of a spring so as to form one of said clamp-type mounts with each said overlapped contact portion for holding at least one semiconductor wafer.

5. A semiconductor arrangement as defined in claim 4 wherein the said plurality of conductor portions associated with said other contact bar are bent so that said other contact bar contacts one surface of said contact portions and said plurality of bar-shaped conductor portions associated with said further contact bar are bent so that said further contact bar contacts the opposite surface of said contact portions.

6. A semiconductor arrangement as defined in claim 4 wherein the said plurality of conductor portions associated with each of said other further contact bars are bent so that both of said contact bars contact the same surface of said contact portions in side by side relationship.

7. A semiconductor arrangement as defined in claim 3 wherein at least one bent section of said conductor portions is provided for insertion within a housing, and wherein said bent portion is configurated and dimensioned to serve as a plug-in mount for said geometric structure in said housing.

8. A semiconductor arrangement as defined in claim 4 wherein said further contact portion is connected to said transport strip via a pair of said bar-shaped conductor portions disposed between a pair of said conductor portions associated with said contact bar; and wherein there are a pair of said planar contact portions disposed between said pair of bar-shaped conductor portions associated with said further contact bar, said contact bar and said further contact bar each contacting each of said pair of planar contact portions.

* * * * *

UNITED STATES PATENT OFFICE
CERTIFICATE OF CORRECTION

Patent No. 3,783,346 Dated January 1st, 1974

Inventor(s) Winfried Schierz

It is certified that error appears in the above-identified patent and that said Letters Patent are hereby corrected as shown below:

In the heading of the patent, after line 12, insert: --Nov. 6, 1970 Germany............ P 20 54 677.4--. Column 3, line 10, change "31" to --21--; lines 23 and 24, change "portion" to --portions--. Column 5, line 65, change "conductor" (second occurrence) to --semiconductor--. Column 6, line 60, after "other" insert --and--.

Signed and sealed this 3rd day of December 1974.

(SEAL)
Attest:

McCOY M. GIBSON JR.
Attesting Officer

C. MARSHALL DANN
Commissioner of Patents